United States Patent
Nguyen et al.

(10) Patent No.: US 7,023,708 B2
(45) Date of Patent: Apr. 4, 2006

(54) MULTILEVEL CABLE SUPPORT ARM AND SYSTEM AND METHOD INCORPORATING SAME

(75) Inventors: Minh H. Nguyen, Katy, TX (US); Alan B. Doerr, Tomball, TX (US); Stephen N. Bushong, Woodlands, TX (US); Robert Hastings, Spring, TX (US); Jelle M. Schuur, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 161 days.

(21) Appl. No.: 10/324,944

(22) Filed: Dec. 20, 2002

(65) Prior Publication Data

US 2004/0120133 A1   Jun. 24, 2004

(51) Int. Cl.
*H05K 7/02* (2006.01)

(52) U.S. Cl. .......................... 361/810; 174/69
(58) Field of Classification Search ........ 361/826–829, 361/428, 383, 683, 725–728; 312/223.2, 312/273; 174/69; 248/67.7, 68.1, 49, 53
See application file for complete search history.

(56) References Cited

U.S. PATENT DOCUMENTS

| | | | |
|---|---|---|---|
| 3,710,199 A * | 1/1973 | Cignoni, Jr. | 361/827 |
| 4,614,383 A * | 9/1986 | Polley et al. | 312/273 |
| 6,021,047 A * | 2/2000 | Lopez et al. | 361/727 |
| 6,303,864 B1 * | 10/2001 | Johnson et al. | 174/69 |
| 6,305,556 B1 * | 10/2001 | Mayer | 211/26 |
| 6,326,547 B1 * | 12/2001 | Saxby et al. | 174/69 |
| 6,435,354 B1 * | 8/2002 | Gray et al. | 211/26 |

* cited by examiner

*Primary Examiner*—Kamand Cuneo
*Assistant Examiner*—Thanh S Phan

(57) ABSTRACT

A cable support arm for a rack mount system. The cable support arm may have first and second arm sections, which are rotatably coupled one over the other at a hinge. The first and second arm sections also may have hinges, which are coupleable to a rack and a rack mounted device of the rack mount system.

27 Claims, 6 Drawing Sheets

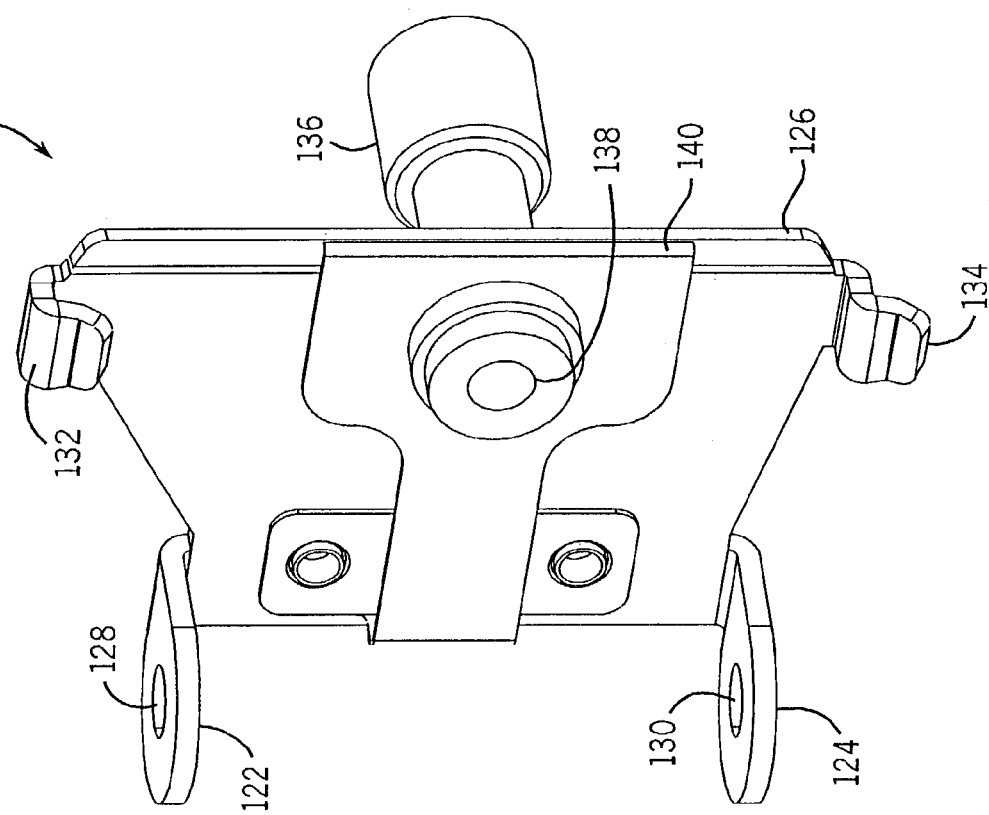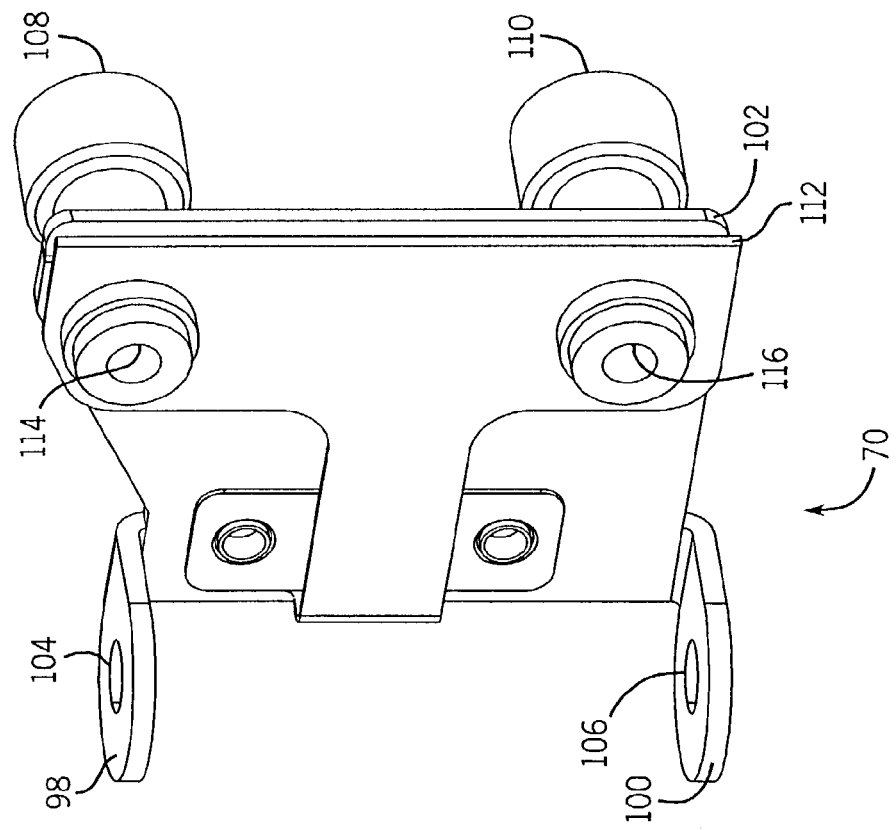

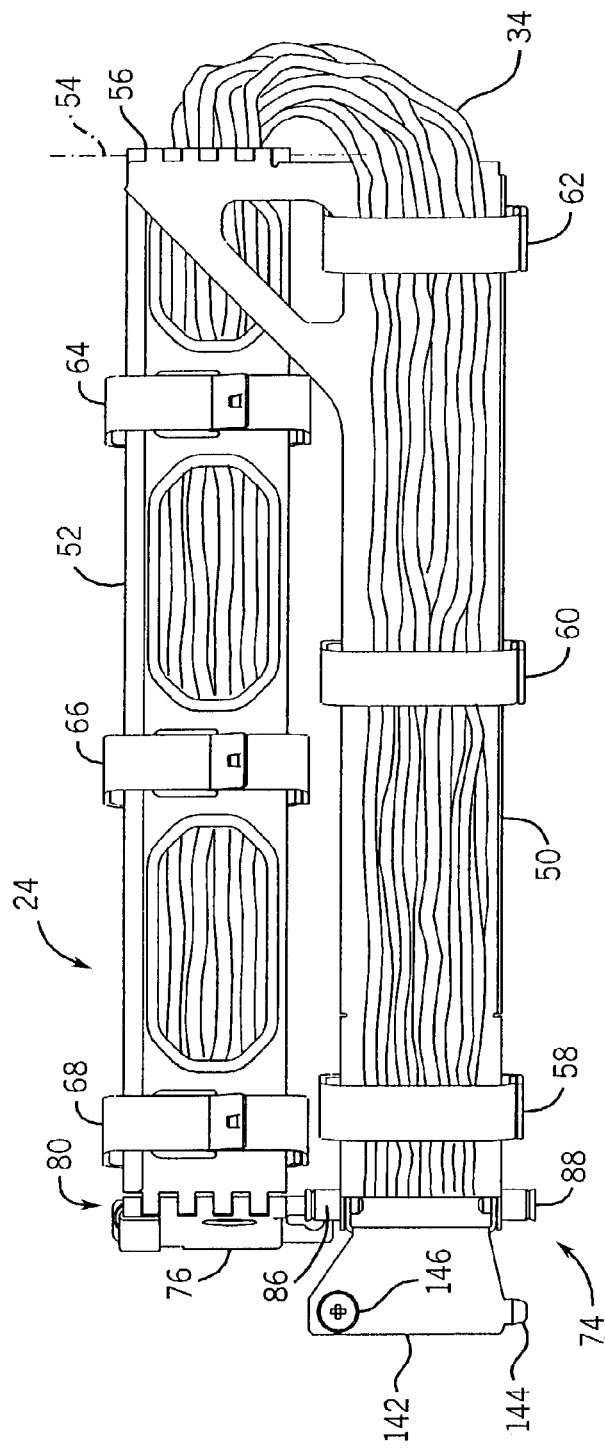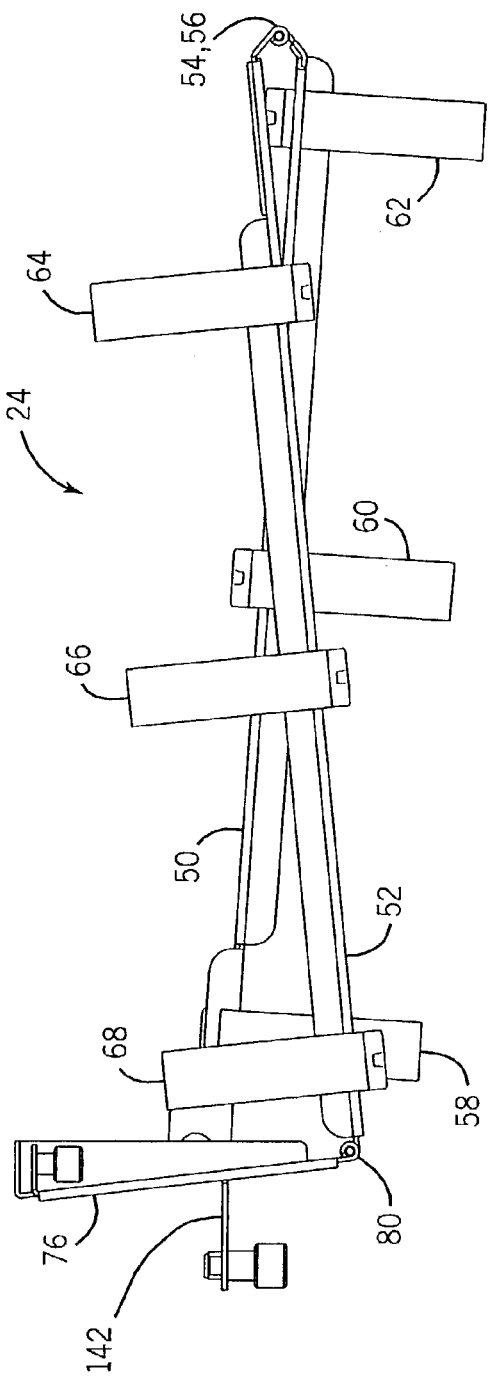
FIG. 5
FIG. 6

MULTILEVEL CABLE SUPPORT ARM AND SYSTEM AND METHOD INCORPORATING SAME

BACKGROUND OF THE INVENTION

This section is intended to introduce the reader to various aspects of art, which may be related to various aspects of the present subject matter described and/or claimed below. The discussion is believed to be helpful in providing the reader with background information to facilitate a better understanding of the various aspects of the present subject matter. Accordingly, it should be understood that these statements are to be read in this light, and not as admissions of prior art.

Rack systems, such as rack mount server systems, have rack spaces for a variety of rack mountable devices. In operation, the rack mountable devices communicate with the rack system through cables, which are routed from each rack mountable device to the rack system. The cables consume considerable space within the rack systems, restrict movement of the rack mountable devices, limit the mounting depth of the rack mountable devices, complicate rear access to the rack mountable devices, and create various other technical constraints.

BRIEF DESCRIPTION OF THE DRAWINGS

Exemplary embodiments will hereafter be described with reference to the accompanying drawings, wherein like reference numerals denote like elements, and:

FIGS. 3 and 4 are perspective views illustrating alternative embodiments of a rack mounting bracket for the multilevel cable support arm illustrated in FIGS. 1 and 2;

FIG. 5 is a rear view further illustrating the multilevel cable support arm of FIG. 1;

FIG. 6 is a top view further illustrating the multilevel cable support arm of FIG. 1;

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in detail below, the present technique provides a unique system and method for supporting one or more cables or cords between a rack and a rack mounted device. However, the present technique may be used to mount one or more cables or cords between a variety of components in a movable relationship. Moreover, a variety of movable carrier mechanisms, rotatable joint mechanisms, swappable mounts, and attachment mechanisms may be used within the scope of the present technique.

Figure 1:
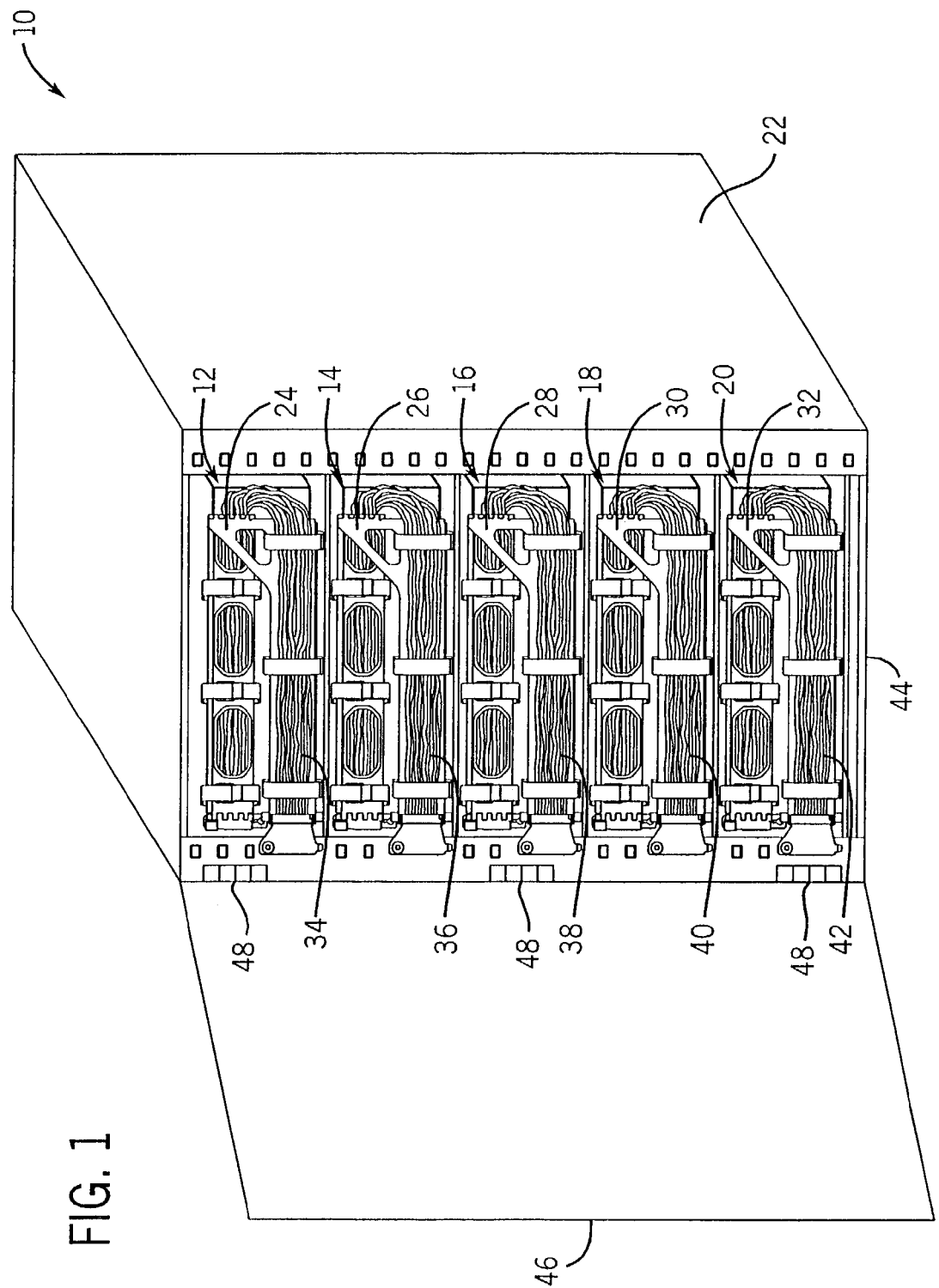
FIG. 1 is a perspective view illustrating an embodiment of the present technique having a multilevel cable support arm coupled to a rack system.

FIG. 1 is a perspective view of an exemplary rack mount system 10 of the present technique. As illustrated, the rack mount system 10 includes a plurality of rack mounted devices, such as rack mountable devices 12, 14, 16, 18, and 20, which are disposed in a rack structure 22. For example, the rack mountable devices 12–20 may comprise a variety of computing components, such as a rack mountable server. The rack structure 22 may have any number and configuration of rack mount receptacles having supports, such as manual or automatic rail mechanisms, which support the rack mountable devices 12, 14, 16, 18, and 20 movably within the rack structure 22.

The rack mount system 10 also may have a plurality of cables extending between the rack mountable devices 12, 14, 16, 18, and 20 and the rack structure 22. Accordingly, the rack mount system 10 may comprise one or more cable support structures, such as cable support arms 24, 26, 28, 30, and 32. The cable support arms 24, 26, 28, 30, and 32 may be rotatably coupled to the rack structure 22 and to the respective rack mountable devices 12, 14, 16, 18, and 20, such that cables can be moveably supported between the rack structure 22 and the rack mountable devices 12–20. As discussed in further detail below, the cable support arms 24–32 may route cables 34, 36, 38, 40, and 42 in a generally U-shaped route around a rotational axis, which may be substantially parallel to a rear face 44 of the rack structure 22 and the respective devices 12, 14, 16, 18, and 20. The rack structure 22 also may have a rear access door 46 coupled to the rack structure 22 via one or more hinges 48.

In a closed configuration, as illustrated in FIG. 1, the cable support arms 24–32 may support the cables 34–42 in a relatively low profile configuration (e.g., stacked configuration) between the rear face 44 and the rack mountable devices 12–20 disposed within the rack structure 22. If a user desires access to the cables 34–42, then the user may open the rear access door 46. If the user desires access to rear portions (e.g., input/output connectors) of the rack mountable devices 12, 14, 16, 18, and 20, then the user may rotate the respective cable support arm 24, 26, 28, 30, and 32 outwardly from the rear face 44 to gain the desired rear access (e.g., FIG. 9). The cable support arms 24–32 also may extend inwardly from the rear face 44 into the rack structure 22 as the respective rack mountable device 12–20 is extracted from the rack structure 22 (e.g., FIG. 8). Accordingly, the cable support arms 24–32 facilitate access to rear portions of the rack mountable devices 12–20, while also reducing space consumption for supporting the cables 34–42 movably between the rack structure 22 and the rack mountable devices 12–20.

Figure 2:
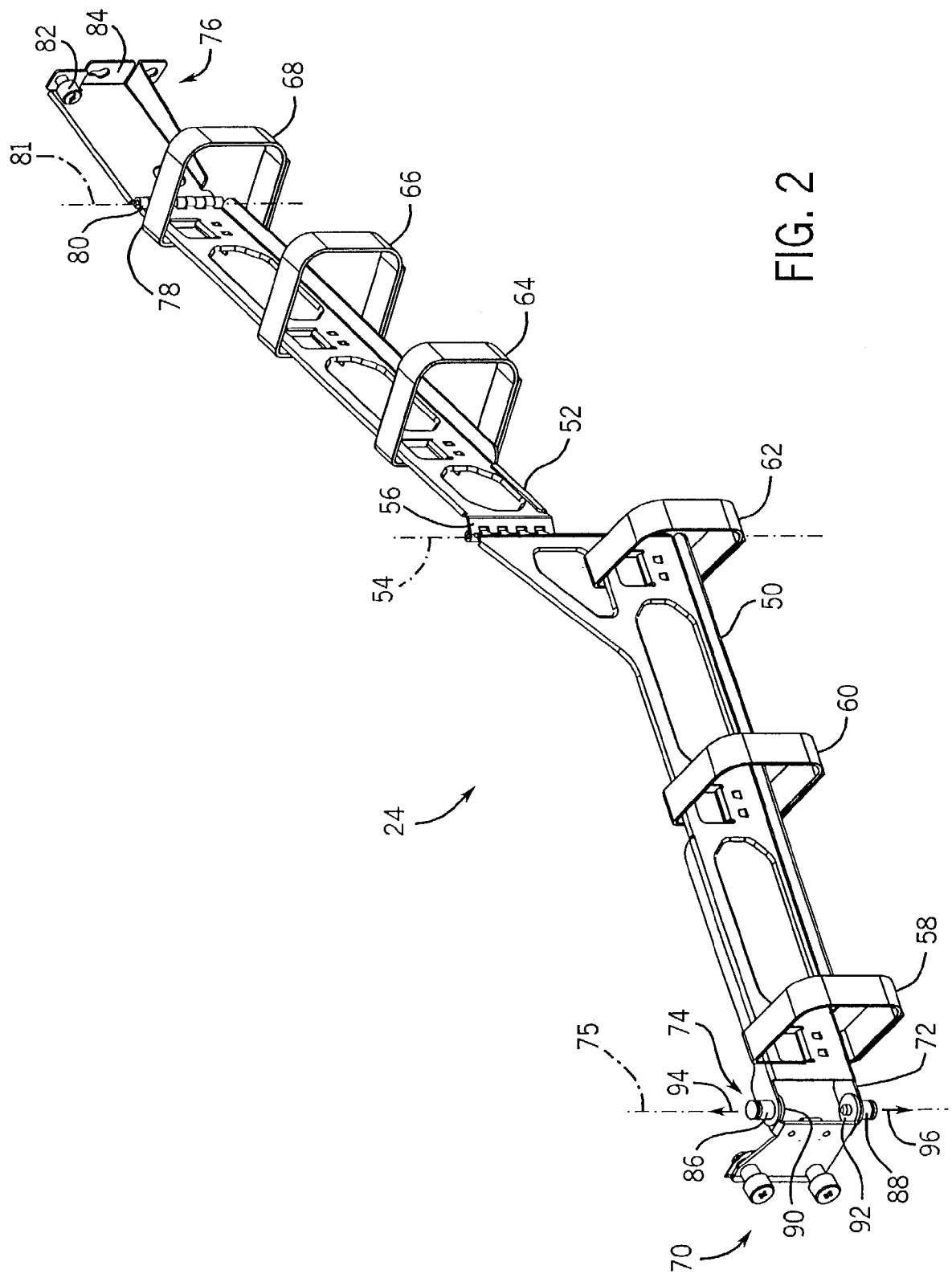
FIG. 2 is a perspective view further illustrating the multilevel cable support arm of FIG. 1.

An exemplary embodiment of the cable support arm 24 is illustrated in FIG. 2. As illustrated, the cable support arm 24 has arm sections 50 and 52 rotatably coupled in a stacked configuration (i.e., one over the other) along a rotational axis 54 via hinge 56. The hinge 56 may be any suitable pivotal mechanism, such as a pivot joint, a multi-joint hinge, and so forth. The cable support arm 24 also may have a cable mounting mechanism to support the desired cables along the arm section 50, along the rotational axis 54 between the arm sections 50 and 52, and along the arm section 52. For example, the cable support arm 24 may have one or more cable mounting straps, such as cable mounting straps 58, 60, 62, 64, 66, and 68. The cable mounting straps 58–68 may comprise a variety of materials and attachment mechanisms, such as plastic, metal, or cloth straps having toolfree connectors (e.g., Velcro, snap-fit, friction mechanism, elastic or compressive mechanism, etc.).

As illustrated in FIG. 2, the cable support arm 24 also may have a variety of mounting brackets to mount the arm sections 50 and 52 to the rack structure 22 and to the desired rack mountable device 12–20. For example, the cable support arm 24 may have a rack mounting bracket 70 rotatably coupled to a bracket mounting end 72 of the arm section 50 via a releasable hinge mechanism 74. Although any suitable pivotal mechanism may be used for the hinge mechanism 74, the present technique may use the releasable hinge mechanism 74 to facilitate removal, replacement, and exchange of the rack mounting bracket 70 with any one of a variety of identical or different rack mounting brackets. Accordingly, the cable support arm 24 may be mounted to a wide variety of rack structures with different mounting mechanisms. It also should be noted that the hinge mechanism 74 extends through a rotational axis 75, which may be parallel with the rotational axis 54.

The cable support arm 24 also may have a device mounting bracket 76 rotatably coupled to a bracket mounting end 78 of the arm section 52 via a hinge mechanism 80. As with the rack mounting bracket 70, the device mounting bracket 76 may be releasably or nonreleasably coupled to the arm section 52. Accordingly, if a variety of different mounting mechanisms are expected for the rack mountable devices 12–20, then the present technique may implement a release mechanism on the rack mounting bracket 70 to facilitate exchange with a desired mounting mechanism. Again, the hinge mechanism 80 extends through a rotational axis 81, which may be parallel with the rotational axis 54. The hinge mechanisms 74 and 80 also may be alignable along a common axis (i.e., axes 75 and 81), such that the arm sections 50 and 52 may be rotated jointly in a direction outwardly from the rack structure 22 (e.g., see FIG. 9)

The rack mounting bracket 70 and the device mounting bracket 76 may comprise a variety of mounting structures, such as a threaded fastener, a latch mechanism, a toolfree attachment mechanism, or any other suitable coupling mechanism. As illustrated, the device mounting bracket 76 has a threaded fastener 82 and a key-shaped slot 84. The illustrated rack mounting bracket 70 also may comprise a variety of mounting mechanisms, such as threaded fasteners, latch mechanisms, key-shaped slots, and so forth. If a different mounting mechanism is desired for the arm section 50, then the rack mounting bracket 70 may be exchangeable with a desired bracket of a plurality of rack mounting brackets via the releasable hinge mechanism 74. In the illustrated embodiment, the rack mounting bracket 70 can be released from the bracket mounting end 72 by moving releasable pins 86 and 88 outwardly from pin receptacles 90 and 92, as illustrated by arrows 94 and 96, respectively. The releasable pins 86 and 88 also may be spring-biased toward the pin receptacles 90 and 92. However, any other suitable release mechanism is within the scope of the present technique.

A detailed illustration of the rack mounting bracket 70 detached from the arm section 50 is provided in FIG. 2. As illustrated in FIG. 3, the rack mounting bracket 70 has pin brackets 98 and 100 extending from a mounting panel 102. The pin brackets 98 and 100 have receptacles 104 and 106 for receiving the releasable pins 86 and 88, respectively. Accordingly, the rack mounting bracket 70 is rotatable about the releasable pins 86 and 88 at the pin brackets 98 and 100. In the illustrated embodiment, the rack mounting bracket 70 has externally threaded fasteners 108 and 110 extending rotatably through the mounting panel 102. The externally threaded fasteners 108 and 110 also may be rotatably retained by the mounting panel 102. Opposite the mounting panel 102, the rack mounting bracket 70 has a mounting panel 112, which has internally threaded fasteners 114 and 116 retained in alignment with the externally threaded fasteners 108 and 110, respectively. Accordingly, the mounting panels 102 and 112 may be positioned about a panel of the rack structure 22, such that the fasteners 108 and 114 and fasteners 110 and 116 align with mounting holes in the rack structure 22. The externally threaded fasteners 108 and 110 may then be engaged with the respective internally threaded fasteners 114 and 116 to secure the rack mounting bracket 70 to the rack structure 22.

As mentioned above, the rack mounting bracket 70 may be exchanged with a variety of different types and configurations of mounting mechanisms. FIG. 4 is a perspective view of an alternative rack mounting bracket 120. In this exemplary embodiment, the rack mounting bracket 120 comprises pin brackets 122 and 124 extending from a mounting panel 126. Again, the pin brackets 122 and 124 have receptacles 128 and 130, which are engageable with the releasable pins 86 and 88. In operation, the rack mounting bracket 120 may be rotated about the releasable pins 86 and 88. The rack mounting bracket 120 also may have a variety of latch members, such as latches 132 and 134, which are engageable with mating latch receptacles in the rack structure 22. The rack mounting bracket 120 also may have a fastening mechanism to secure the mounting panel 126 to the rack structure 22 after engaging the latches 132 and 134 with the rack structure 22. In the illustrated embodiment, the rack mounting bracket 120 may have an externally threaded fastener 136 extending rotatably through the mounting panel 126. The externally threaded fastener 136 also may be rotatably retained by the mounting panel 126. Opposite the mounting panel 126, the rack mounting bracket 120 has a mounting panel 140, which has an internally threaded fastener 138 retained in alignment with the externally threaded fastener 136. In operation, the mounting panels 126 and 140 may be disposed about a panel of the rack structure 22, such that the externally threaded fastener 136 may be extended through a receptacle in the rack structure 22 into engagement with the internally threaded fastener 138. The externally and internally threaded fastener 136 and 138 may then be rotatably coupled to secure the rack mounting bracket 120 to the rack structure 22.

It should be noted that any suitable latching and fastening mechanisms can be used within the scope of the present technique. However, each of the alternative rack mounting brackets 70 and 120 and any other desired rack mounting brackets may have certain fastening and mounting features to accommodate a particular configuration and type of rack structure, such as the rack structure 22. The foregoing rack mounting brackets 70 and 120, and a variety of other desired brackets, are exchangeably mountable to the cable support arm 24 via the releasable hinge mechanism 74. Accordingly, the cable support arm 24 may be mounted to a variety of different types of rack structures.

The cable support arm 24 is further illustrated with reference to FIGS. 5 and 6, which have another alternative rack mounting bracket 142 coupled to the arm section 50 via the releasable hinge mechanism 74. The illustrated rack mounting bracket 142 has a latch 144 and a fastener assembly 146. As discussed above, rack mounting bracket 142 may have any suitable latching and fastening mechanisms, such as toolfree connectors, threaded fasteners, and so forth.

As illustrated in the rear view of FIG. 5, the cable support arm 24 may have a generally stacked configuration of the arm section 52 over the arm section 50. In this stacked configuration, the arm sections 50 and 52 may be rotated about the hinge 56, the releasable hinge mechanism 74, and the hinge mechanism 80 with a greater degree of flexibility. For example, the arm sections 50 and 52 may be rotated inwardly and outwardly relative to a mounting plane, such as the rear face 44 of the rack structure 22. The arm sections 50 and 52 also may be rotated across one another in a forward expanding V-shaped configuration and, also, in a reverse storage V-shaped or X-shaped configuration. In operation, the arm sections 50 and 52 support one or more cables in route, which has a relatively low profile in a closed configuration of the rack mountable device within the rack structure 22. For example, the cable support arm 24 may support one or more communication cables 34 in a U-shaped cable route extending through the cable mounting straps 58–68. In this U-shaped cable route, the cable 34 extends along the arm section 50, curves along the rotational axis 54 from the arm section 50 to the arm section 52, and extends along the arm section 52 to the device mounting bracket 76. The foregoing cable route orients the one or more communication cables 34 in plane that is generally parallel (i.e., the rotational axis 54 is parallel) to the rear face 44 of the rack structure 22. In this manner, the cable support arm 24 also orients the cable 34 substantially perpendicular to the direction of movement of the rack mountable device. Accordingly, the cable support arm 24 reduces space consumption of the cables 34 to accommodate a deeper rack mountable device.

As discussed above, the cable support arm 24 may be positionable in a variety of unique expanding, contracting, and closed positions attributed to the stacked configuration of the arm sections 50 and 52. FIG. 6 is a top view of the cable support arm 24 further illustrating the flexible positioning and low profile of the cable support arm 24 and mounted cable 34. In the illustrated embodiment, the cable support arm 24 is disposed in an X-shaped configuration in which the arm sections 50 and 52 are crossed over one another. Depending on the particular configuration of the cable support arm 24, the arm sections 50 and 52 also may be capable of both forward and reverse V-shaped configurations as the cable support arm 24 expands and contracts between open and closed positions of the rack mountable device 12.

Figure 7:
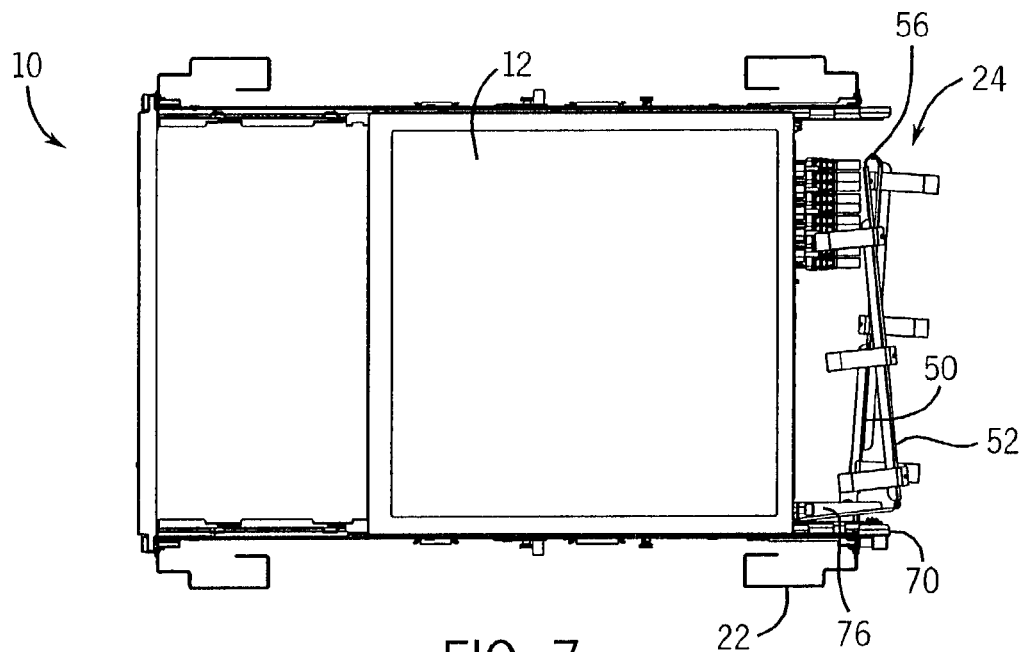
FIG. 7 is a partial top view of the rack system of FIG. 1 illustrating an embodiment of the multilevel cable support arm disposed in a closed configuration.
Figure 8:
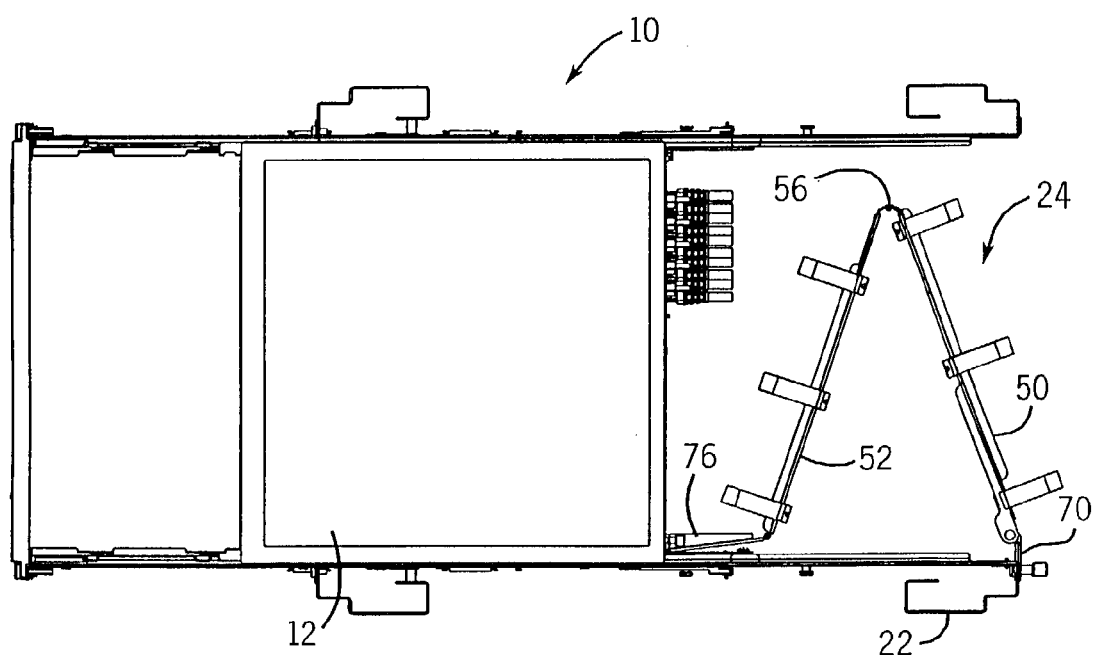
FIG. 8 is a partial top view of the rack system of FIG. 1 illustrating an embodiment of the multilevel cable support arm disposed in a open configuration.
Figure 9:
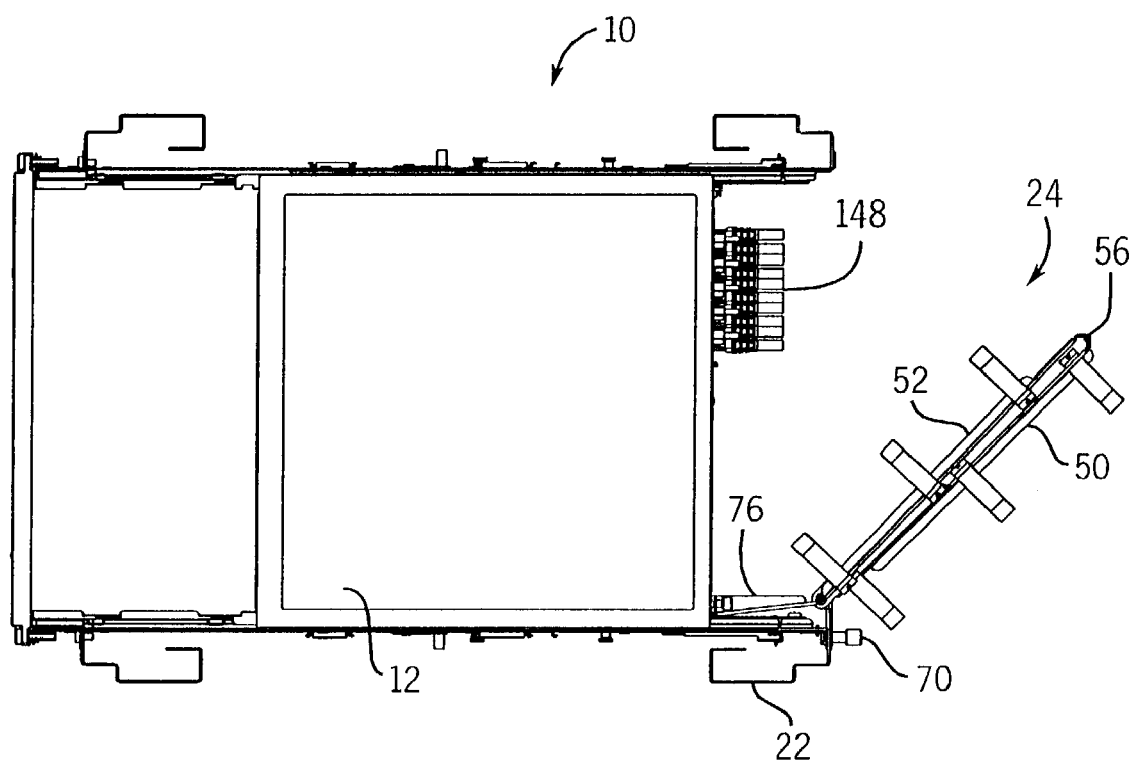
FIG. 9 is a partial top view of the rack system of FIG. 1 illustrating an embodiment of the multilevel cable support arm disposed in a rear access configuration.

Several operational configurations of the present technique are illustrated in FIGS. 7–9, which are partial top views of the rack mount system 10 illustrating the rack mountable device 12 and the associated cable support arm 24 in various positions. In the illustrated embodiment of FIG. 7, the rack mountable device 12 is fully inserted within the rack structure 22, and the cable support arm 24 is disposed in a crossed or X-shaped configuration. In this closed configuration, the cable support arm 24 routes the communication cable 34 along the arm sections 50 and 52 and around the hinge 56 in a generally parallel configuration relative to the rear of the rack mountable device 12. Accordingly, the cable 34 consumes relatively less space behind the rack mountable device 12 than a generally non-parallel or angled configuration (i.e., curving toward the rack mountable device 12). The cable support arm 24 also may be coupled to the rack mountable device 12 and the rack structure 22 via the device mounting bracket 76 and the rack mounting bracket 70, respectively. As mentioned above, the brackets 70 and 76 may be fixedly or releasably hinged to the arm sections 50 and 52, such that the cable support arm 24 may be adapted to any desired rack system.

In operation, the cable support arm 24 expands and contracts in the rack structure 22 in a V-shaped configuration of the arm sections 50 and 52, which remain stacked one over the other at the hinge 56. As illustrated in FIG. 8, the arm sections 50 and 52 expand inwardly into the rack structure 22 (i.e., in a forward direction) as the rack mountable device 12 is slidingly removed from the rack structure 22. Accordingly, a user can access the rack mountable device 12 while the cables 34 remain connected to the rack system 10.

The present technique also facilitates rear access to the rack mountable device 12. As illustrated in FIG. 9, the cable support arm 24 may be rotatable outwardly from the rack structure 22 and the rack mountable device 12, thereby exposing rear controls, receptacles, and components 148 of the rack mountable device 12. For example, the user may align the hinge mechanisms 74 and 80, such that the sections 50 and 52 may be rotatable to a position away from the rear face 44 of the rack structure 22. The user may then access the cables 34, the components 148, and any other previously enclosed features of the rack system 10.

While the subject matter may be susceptible to various modifications and alternative forms, specific embodiments have been shown by way of example in the drawings and will be described in detail herein. However, it should be understood that the subject matter is not intended to be limited to the particular forms disclosed. Rather, the subject matter is to cover all modifications, equivalents and alternatives falling within the spirit and scope of the subject matter as defined by the following appended claims.

What is claimed is:

1. A cable support arm for a rack mount computer system, comprising:
   a first arm section having a first hinge structure coupleable to a rack; and
   a second arm section having a second hinge structure coupleable to a rack mounted computing device, wherein the first and second arm sections are rotatably coupled one over the other along an axis of a third hinge structure positioned substantially parallel with the first and second hinge structures, the first and second arm sections having a plurality of cable supports, wherein the first and second arm sections have a generally X-shaped closed configuration.

2. The cable support arm of claim 1, wherein the first, second, and third hinge structures are adapted to be positioned substantially parallel to a rear face of the rack mounted computing device.

3. The cable support arm of claim 1, wherein the first and second arm sections have a U-shaped cable support route that is adapted to be positioned substantially parallel to a rear face of the rack mounted computing device in a closed position.

4. The cable support arm of claim 1, wherein the first and second arm sections have a V-shaped expanded configuration.

5. The cable support arm of claim 1, wherein the plurality of cable supports comprise a toolfree strap.

6. The cable support arm of claim 1, wherein the first and second arm sections are rotatable inwardly and outwardly from a rear face of the rack.

7. A rack computer system, comprising:
a rack structure having a receptacle adapted to mount a rack mountable computing device; and
a multilevel cable support arm coupled to a rear portion of the rack structure, wherein the multilevel cable support arm comprises a plurality of arm sections rotatably coupled in a stacked configuration that is perpendicular to a direction of movement of the plurality of arm sections, each of the plurality of arm sections having a cable retention strap, wherein the plurality of arm sections have a generally X-shaped closed configuration.

8. The rack computer system of claim 7, wherein the rack structure comprises a server rack having a rail mechanism in the receptacle.

9. The rack computer system of claim 7, wherein the rack mountable computing device is movingly disposed in the receptacle.

10. The rack computer system of claim 9, comprising an input/output cable supported on the multilevel cable support arm between the rack structure and the rack mountable computing device.

11. The rack computer system of claim 10, wherein the input/output cable has a U-shaped route extending between adjacent arm sections of the plurality of arm sections.

12. The rack computer system of claim 7, wherein the multilevel cable support arm is substantially parallel to a rear face of the rack mounted device.

13. The rack computer system of claim 7, wherein the plurality of arm sections have a V-shaped expanding configuration.

14. The rack computer system of claim 7, wherein the cable retention strap comprise a toolfree cable mounting mechanism.

15. The rack computer system of claim 7, wherein the plurality of arm sections are rotatable inwardly and outwardly with respect to a rear of the rack structure.

16. The rack computer system of claim 7, comprising one or more electronic devices mounted in the rack structure.

17. A system, comprising:
a rack having a bay extending from a rear to a front;
a computing device movably mounted in the bay; and
a cable support arm having a first arm coupled to the computing device and a second arm coupled to the rack, the first and second arms each having a cable retention strap, wherein the first and second arms are rotatably coupled one over the other along a rotational axis, and the first and second arms are rotatable outward from the rear to provide rear access to the computing device, wherein the first and second arms are disposed in an X-shaped configuration when the computing device is substantially retracted into the bay.

18. The system of claim 17, wherein the cable support arm comprises a cable mounting route having at least one cable retention strap.

19. The system of claim 17, wherein the computing device is mounted to rails disposed within the bay.

20. The system of claim 17, comprising a plurality of servers mounted in the rack.

21. A system, comprising:
a rack mount server adapted to mount movably within a rack; and
a cable support arm having a first arm coupled to the rack mount server and a second arm adapted to mount to the rack, wherein the first and second arms are rotatably coupled one over the other along a rotational axis, and the first and second arms are rotatable between a V-shaped configuration and an X-shaped configuration.

22. The system of claim 21, wherein the cable support arm comprises a plurality of cable retention straps.

23. The system of claim 21, wherein the cable support arm is adapted to rotate away from the rack to provide rear access to the rack mount server when the rack mount server is mounted within the rack.

24. The system of claim 21, wherein each of the first and second arms comprises a hinge at an end opposite from the rotational axis, and both of the first and second arms are rotatable simultaneously about the hinges when the first and second arms are disposed in the X-shaped configuration.

25. A method of manufacturing a rack computer system, comprising:
rotatably mounting a first arm of a cable support arm to a rack;
rotatably coupling a second arm of the cable support arm to a computing device movably mounted within the rack, wherein the first and second arms are rotatably coupled one over the other along a rotational axis, and the first and second arms are rotatable between a V-shaped configuration and an X-shaped configuration; and
configuring the cable support arm to expand into the rack, to contract to a rear portion of the rack, and to pivot outwardly from the rear portion of the rack to provide rear access to the computing device.

26. The method of claim 25, comprising coupling a plurality of cable retention straps to the cable support arm.

27. The method of claim 25, comprising mounting a plurality of computing devices to the rack.

* * * * *